(12) United States Patent
Monfray et al.

(10) Patent No.: US 7,196,451 B2
(45) Date of Patent: Mar. 27, 2007

(54) ELECTROMECHANICAL RESONATOR AND METHOD FOR FABRICATING SUCH A RESONATOR

(75) Inventors: Stephane Monfray, Grenoble (FR); Pascal Ancey, Revel (FR); Thomas Skotnicki, Crolles Montfort (FR); Karim Segueni, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 19 days.

(21) Appl. No.: 10/895,616

(22) Filed: Jul. 21, 2004

(65) Prior Publication Data
US 2005/0199970 A1  Sep. 15, 2005

(30) Foreign Application Priority Data
Jul. 25, 2003 (FR) .................................. 03 09106

(51) Int. Cl.
*H02N 1/00* (2006.01)
(52) U.S. Cl. ...................... 310/311; 310/309
(58) Field of Classification Search ............. 310/311, 310/330, 331, 332, 309, 328; 333/186, 197, 333/200; 257/235
See application file for complete search history.

(56) References Cited
U.S. PATENT DOCUMENTS

| 6,275,122 B1 | 8/2001 | Speidell et al. | |
| 6,469,597 B2 * | 10/2002 | Ruby et al. | 333/187 |
| 6,495,403 B1 * | 12/2002 | Skotnicki et al. | 438/157 |
| 6,877,209 B1 * | 4/2005 | Miller et al. | 29/594 |
| 2001/0016367 A1 | 8/2001 | Ziegler | |
| 2004/0080243 A1 * | 4/2004 | Miyazawa | 310/328 |
| 2005/0003657 A1 * | 1/2005 | Cho | 438/640 |

FOREIGN PATENT DOCUMENTS

| EP | 0816861 A2 | 1/1998 |
| FR | 2 799 305 | 4/2001 |
| FR | 2 823 032 | 10/2002 |

OTHER PUBLICATIONS

Preliminary Search Report for French Application No. 03 09106 dated May 4, 2004.

* cited by examiner

*Primary Examiner*—Darren Schuberg
*Assistant Examiner*—Derek Rosenau
(74) *Attorney, Agent, or Firm*—Lisa K. Jorgenson; Jose Gutman; Fleit, Kain, Gibbon, Gutman, Bongini & Bianco P.L.

(57) ABSTRACT

An electromechanical resonator includes a monocrystalline-silicon substrate (S) provided with an active zone (ZA) delimited by an insulating region, a vibrating beam (10) anchored by at least one of its free ends on the insulating region and including a monocrystalline-silicon vibrating central part (12), and a control electrode (E) arranged above the beam and bearing on the active zone. The central part (12) of the beam is separated from the active zone (ZA) and from the control electrode (E).

14 Claims, 5 Drawing Sheets

ELECTROMECHANICAL RESONATOR AND METHOD FOR FABRICATING SUCH A RESONATOR

CROSS-REFERENCE TO RELATED APPLICATION

This application is based upon and claims priority from prior French Patent Application No. 03 09106, filed on Jul. 25, 2003, the entire disclosure of which is herein incorporated by reference.

BACKGROUND OF THE INVENTION

1. Field of the Invention

The invention relates to an electromechanical resonator and to a method for fabricating such a resonator. More particularly, the invention relates to the production of such a resonator in an integrated form, that is to say by using a technology generally used for the production of integrated circuits.

2. Description of the Related Art

Electromechanical resonators, and in particular those resonators which operate in a bending vibration mode, are conventionally produced in the form of a vibrating element connected to a control electrode, with a detection electrode measuring a characteristic of the integrated circuit, which is associated with the vibration of the vibrating element.

Various techniques may be used for the production of such a resonator. The vibration frequency of the resonator, however, which moreover depends on the dimensions and the mechanical characteristics of the vibrating element, is dictated by the technique which is used.

For example, according to one technique for fabricating an integrated resonator, according to which the vibrating element is formed superficially and is therefore arranged above a semiconductor electronic circuit, the performance of the resonator is relatively limited, particularly because the compatibility requirements of the materials being employed make it necessary to use specific materials for forming the resonator. In particular, the vibrating element can then in general only be made of amorphous silicon, polycrystalline silicon or nitride.

Such resonators hence cannot in general vibrate at frequencies higher than a few tens of MHz.

Accordingly, there exists a need for overcoming the disadvantages of the prior art as discussed above.

SUMMARY OF THE INVENTION

It is therefore an object of the invention to overcome these drawbacks and to produce an electromagnetic resonator having enhanced performance while maintaining a high level of integration.

The invention therefore provides an electromechanical resonator comprising a monocrystalline-silicon substrate provided with an active zone delimited by an insulating region.

It furthermore includes a vibrating beam anchored by at least one of its free ends on the insulating region and comprising a monocrystalline-silicon vibrating central part, and a control electrode arranged above the beam and bearing on the active zone, the central part of the beam being separated from the active zone and from the control electrode.

Forming the vibrating element actually inside the semiconductor device hence makes it possible to make it from monocrystalline silicon, and therefore to multiply the vibration frequency of the resonator by a factor which may be as much as about 10.

Such a resonator can furthermore be produced by using a technology referred to as "SON" ("Silicon On Nothing") technology, which allows the principal elements of the resonator to be formed by using techniques of epitaxial growth and etching, which is a particularly precise technique in dimensional terms. It is then possible to control in a particularly precise way the dimensions of the resonator, and in particular of the vibrating beam, and to do so with fabrication tolerances of the order of one nanometer.

According to another characteristic of the invention, it furthermore includes at least one detection electrode connected to the active zone.

For example, it includes two detection electrodes in contact with the active zone and arranged above the central part, on either side of the control electrode, while being separated from the beam.

In one embodiment, the space between the beam, on the one hand, and the substrate and the control electrode, on the other hand, being obtained by selective etching of a sacrificial-material layer, it includes at least a first encapsulation-material layer provided with holes for access to the sacrificial-material layer and a second encapsulation-material layer used for plugging the access holes after the sacrificial-material layer has been etched through the access holes.

Electrical contact vias are also provided for access to the control electrode and to the vibrating beam.

According to another characteristic of the invention, the beam is made of doped monocrystalline silicon, the end part or parts of the beam, by which it is anchored on the insulating region, being made of doped polycrystalline silicon.

The invention also provides a method for fabricating an electromagnetic resonator as defined above, wherein it includes the following steps:

deposition by selective epitaxial growth of a sacrificial-material layer on the active zone of a monocrystalline substrate, which is delimited by an insulating region;

deposition by nonselective epitaxial growth of a silicon layer so that this layer covers the underlying sacrificial-material layer and the insulating region;

etching of the silicon layer so as to form a beam anchored by at least one of its ends on the insulating region;

selective epitaxial growth of the sacrificial-material layer so that the sacrificial-material layer surrounds the beam;

formation of at least one electrode above the beam and in contact with the active zone; and removal of the sacrificial-material layer by selective etching with respect to the silicon and the insulator of the insulating region.

According to one embodiment, a central control electrode and two lateral detection electrodes are formed.

Furthermore, according to another characteristic of the method according to the invention, after the step of selective epitaxial growth of the sacrificial-material layer, a masking layer is deposited; holes for access to the silicon of the beam are etched; a second masking layer is deposited; and holes for access to the sacrificial material are etched in the second masking layer; and, after the etching of the sacrificial material, a nonconformal insulation-material layer is deposited in order to plug the access holes, and vias for electrical contact with the vibrating beam and the control electrode are formed.

Preferably, the deposition of the insulation material is carried out at a low pressure.

Advantageously, the sacrificial material is silicon-germanium.

According to an advantageous embodiment, during the formation of the vias, contact holes are formed and the holes are filled with an electrically conductive material, and the contact hole intended to form the via for contact with the control electrode is used to carry out localized ion implantation in the control electrode.

BRIEF DESCRIPTION OF THE DRAWINGS

Other objects, characteristics and advantages of the invention will become apparent on reading the following description, which is provided solely by way of nonlimiting example and is given with reference to the appended drawings, in which.

DETAILED DESCRIPTION

Referring firstly to FIGS. 1 to 6, the principal phases of an embodiment of a method for fabricating an electromechanical resonator according to the invention will be described.

Figure 1:
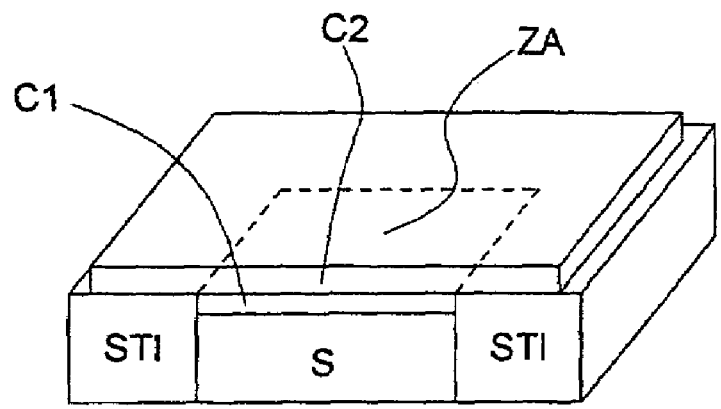
FIGS. 1 to 6 are schematic views illustrating the principal successive phases of a method for fabricating an electromagnetic bending resonator according to the invention.
Figure 2:
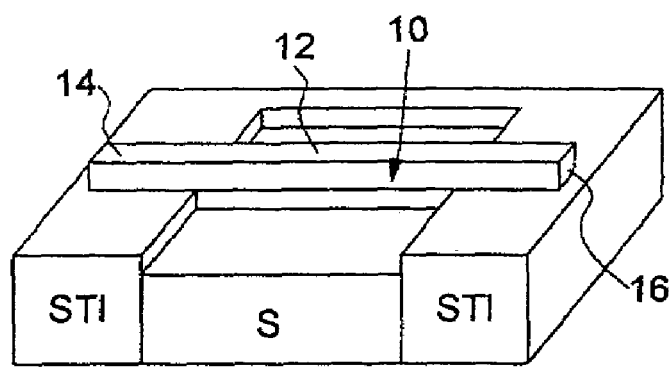

As represented in FIG. 1, the starting structure for the production of the resonator consists of a silicon substrate S, in which is formed an active zone ZA surrounded by an insulating region STI (Shallow Trench Isolation).

On the basis of this structure, a sacrificial-material layer C1, preferably consisting of silicon-germanium (SiGe), is formed by selective epitaxy above the active zone ZA. A silicon layer C2 is then grown by nonselective epitaxy.

The techniques of growth by selective and nonselective epitaxy are conventional techniques within the scope of a person skilled in the art. They will not therefore be described in detail below. It will, however, be pointed out that these steps make it possible to obtain a localized SiGe layer on the active zone ZA, a monocrystalline-silicon layer on the underlying sacrificial-material layer and a polycrystalline-silicon layer on the insulating region STI which laterally extends the monocrystalline-silicon layer.

The silicon and the sacrificial-material layer are then etched in order to form a beam 10 comprising a central part 12 made of monocrystalline silicon and polycrystalline-silicon end parts 14 and 16, by which the beam is anchored on the insulating region STI, the sacrificial material between the beam and the active zone (FIG. 2) being kept.

Figure 3:
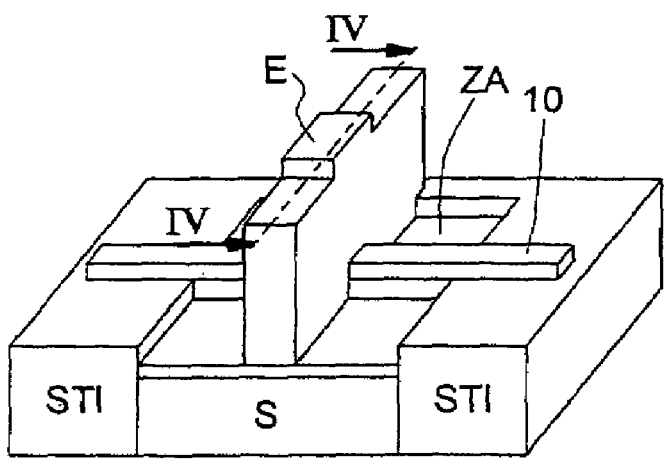
Figure 4:
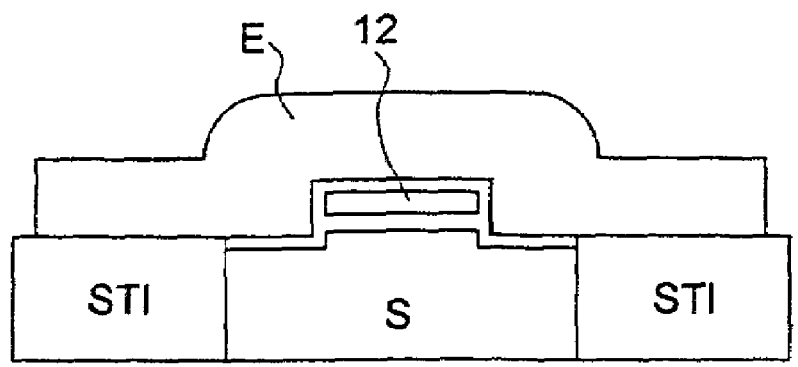

As shown by FIGS. 3 and 4, selective epitaxy of the SiGe is carried out during the next step so that this sacrificial material covers the beam 10 as well as the active zone ZA. A control electrode as can be seen in these figures is then formed according to a conventional technique, for example by depositing polycrystalline silicon and etching the electrode E according to a desired contour. The electrode E formed in this way extends over the beam 10 and bears on the active zone ZA. After this step of epitaxial growth of the silicon-germanium and formation of the control electrode E, the sacrificial material is selectively etched. This etching needs to be selective, on the one hand, vis-à-vis the silicon of the control electrode and of the substrate, but also vis-à-vis the insulator of the insulating region STI.

Figure 5:
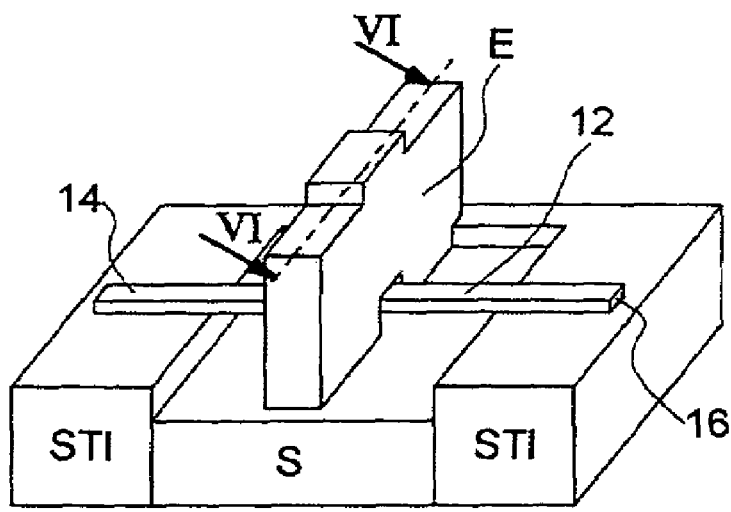
Figure 6:
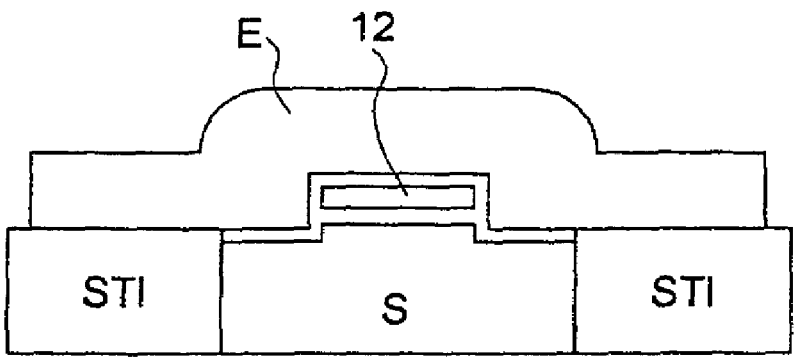

As can be seen in FIG. 5 and in FIG. 6, which represents a view in section on the lines VI—VI in FIG. 5, after this step of selectively removing the silicon-germanium, a beam is obtained which is anchored by its mutually opposite free ends 14 and 16 on the insulating region STI, and the central part 12 which is suspended above the active zone and is separated from the control electrode E by a space corresponding to the thickness of the etched sacrificial-material layer. Likewise, the control electrode E is suspended above the beam while continuing to bear against the active zone.

As is known, this control electrode E is used to cause excitation of the beam, so that it is made to vibrate at a frequency which is dictated, in particular, by the structural characteristics and by the mechanical characteristics of the beam. Owing to the use of monocrystalline silicon for the active part of the beam, that is to say for its central part, a vibration frequency is obtained which may amount to frequencies of the order of one GHz.

The vibration frequency of the beam is measured by using one or more detection electrodes connected to the active zone, for example electrodes capable of measuring the value of the capacitance formed by the gap around the vibrating element 12.

Figure 7:
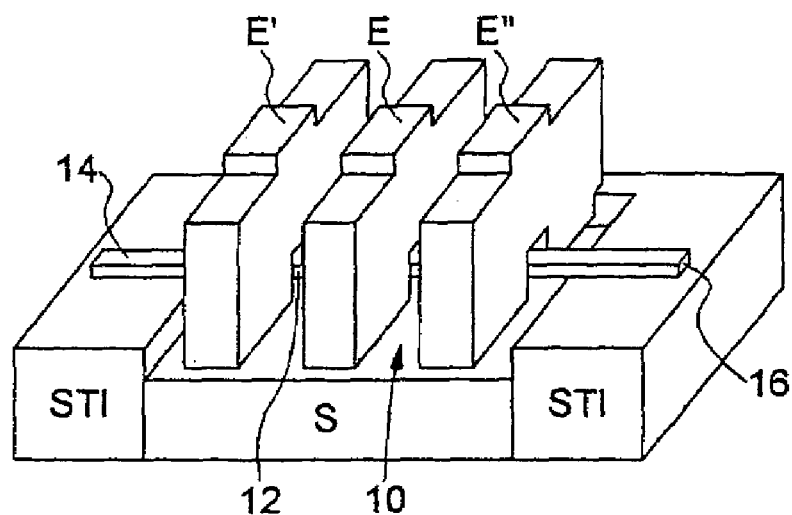
FIG. 7 is a diagram illustrating an alternative embodiment of an electromechanical resonator according to the invention.

As can be seen in FIG. 7, according to one embodiment, the detection electrodes E' and E" are formed simultaneously with the formation of the control electrode (FIG. 3), for example by using a specific photolithography mask and specific etching, so as to form a central control electrode for activation of the vibrating beam 10, and two lateral detection electrodes E' and E" arranged on either side of the control electrode E, for detection and measurement of the vibration frequency of the beam 10.

Another embodiment of a method for fabricating an electromechanical resonator according to the invention will now be described with reference to FIGS. 8 to 13.

Figure 8:
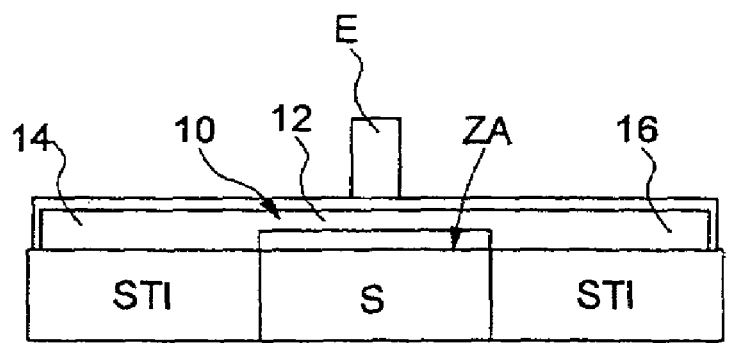
FIGS. 8 to 13 are views in schematic section illustrating successive steps of a particular embodiment of a fabrication method according to the invention.

As can be seen in FIG. 8, the starting structure for this variant corresponds to the phase of the process described above with reference to FIG. 3. In other words, it begins with a starting substrate having an active zone ZA formed in a silicon substrate S and delimited by an insulating region STI on which is anchored a beam 10, the central part 12 of which is made of monocrystalline silicon and the end zones 14 and 16 of which, anchored on the insulating region STI, are made of polycrystalline silicon. The beam is surrounded by sacrificial material consisting of silicon-germanium. A polycrystalline-silicon control electrode E is furthermore formed above the beam 10.

Figure 9:
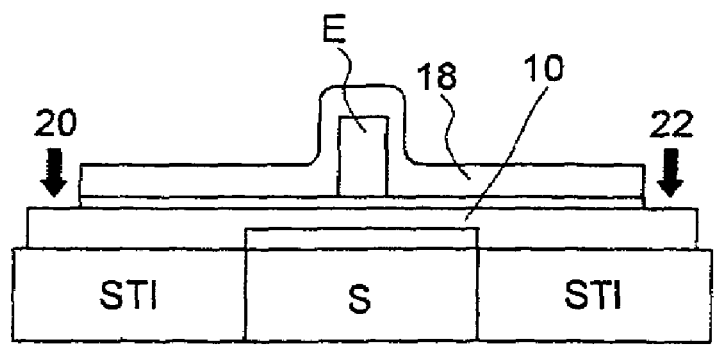

As can be seen in FIG. 9, on the basis of this structure, a first masking layer 18 is deposited on all of the semiconductor device, for example a layer of silicon nitride $Si_3N_4$, then this masking layer 18 is etched so as to free the future electrical-contact zones 20 and 22 which will be used for electrical connection of the beam 10.

Figure 10:
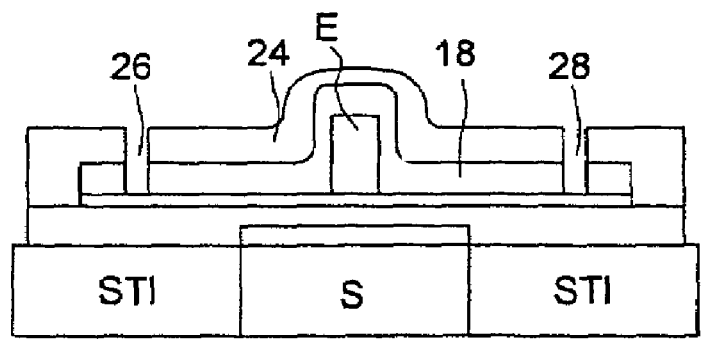

Referring now to FIG. 10, an oxide layer 24 is subsequently deposited everywhere, and then holes 26 and 28 for access to the sacrificial material are etched.

Figure 11:
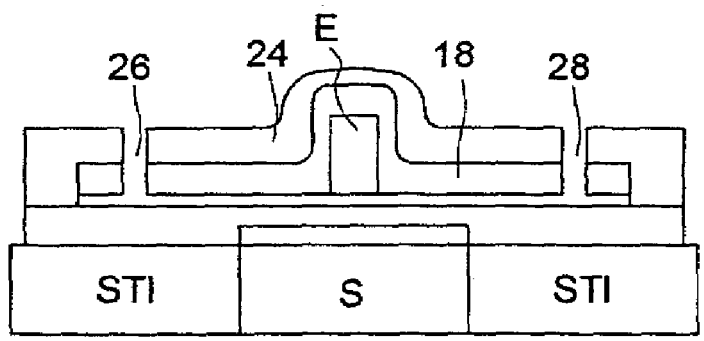

Selective withdrawal of the silicon-germanium layers is then carried out in order to free the central part 12 of the beam, in order to allow it to vibrate freely (FIG. 11).

Figure 12:
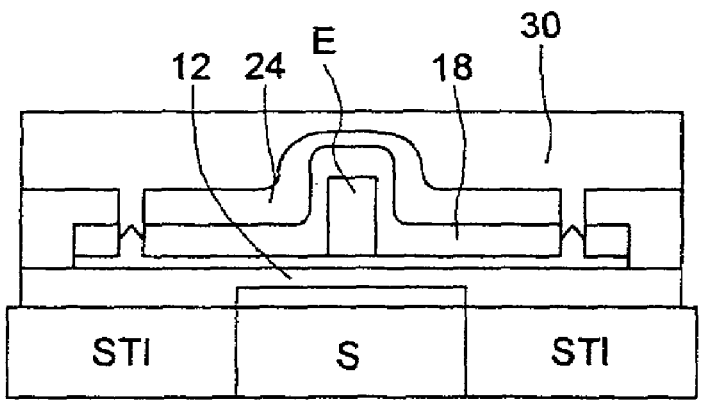

Referring now to FIG. 12, a nonconformal insulation-material layer 30 is then deposited everywhere in order to plug the access holes 26 and 28, and planarization of the device is carried out. It will be noted that the insulation-material layer 30 is preferably deposited at a low pressure in order to avoid filling the space surrounding the vibrating part 12 of the beam.

Figure 13:
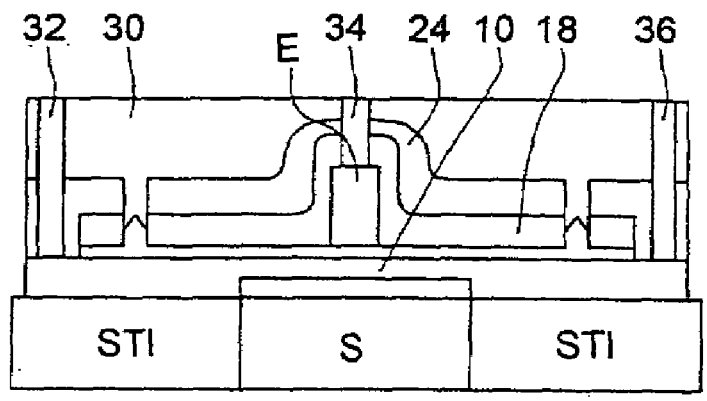

Lastly, with reference to FIG. 13, the vias 32, 34 and 36 for electrical connection of the control electrode and of the beam 10 are formed. As is well known to a person skilled in the art, these vias are produced by forming holes and filling these holes with an electrically conductive material.

It will be noted that the beam is rendered conductive by dopant implantation in the various embodiments described above, for example by implanting a dopant of the same conductivity type as the substrate S.

Figure 14:
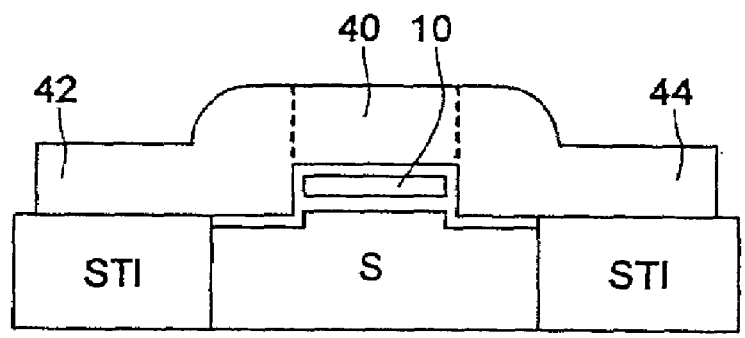
FIGS. 14 and 15 illustrate another variant of a fabrication method according to the invention.

Referring to FIG. 14, with a view to preventing stray capacitances from being formed on either side of the beam, in between the polycrystalline silicon constituting the control electrode E and the silicon constituting the substrate S, the control electrode E is rendered conductive only in a zone 40 located above the vibrating beam 10, this zone being bordered laterally by two insulating zones 42 and 44.

Figure 15:
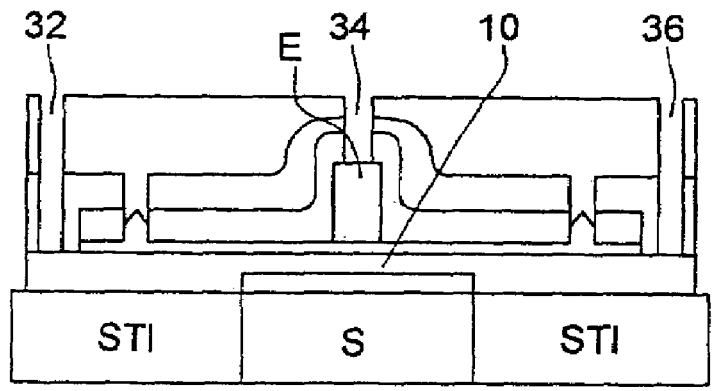

As can be seen in FIG. 15, this arrangement is obtained by using an intrinsic polycrystalline silicon as the constituent material of the control electrode, and by doping the zone 40 of the electrode lying above the beam 10. This implantation is carried out by using the hole 34, before it is filled with an electrically conductive material in order to form the via 34 for electrical connection of the control electrode.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An electromechanical resonator, comprising:
   a monocrystalline-silicon substrate provided with an active zone delimited by an insulating region;
   a vibrating beam anchored by at least one of its free ends on the insulating region and comprising a monocrystalline-silicon vibrating central part; and
   a control electrode arranged above the vibrating beam and bearing on the active zone, the central part of the vibrating beam being separated from the active zone and from the control electrode.

2. The resonator according to claim 1, wherein the vibrating beam is made of doped monocrystalline silicon, and in that the end part or parts of the vibrating beam, by which it is anchored on the insulating region, is or are made of doped polycrystalline silicon.

3. The resonator according to claim 1, including at least one detection electrode connected to the active zone.

4. The resonator according to one of claim 3, including two detection electrodes in contact with the active zone and arranged above the central part, on either side of the control electrode, while being separated from the beam.

5. The resonator according to claim 1, wherein, the space between the vibrating beam, on the one hand, and the substrate and the control electrode, on the other hand, being obtained by selective etching of a sacrificial-material layer, and wherein the resonator includes at least a first encapsulation-material layer provided with access holes for access to the sacrificial-material layer and a second encapsulation-material layer used for plugging the access holes after the sacrificial-material layer has been etched through the access holes.

6. The resonator according to claim 5, further including electrical-contact vias for access to the control electrode and to the vibrating beam.

7. The resonator according to claim 5, wherein the vibrating beam is made of doped monocrystalline silicon, and in that the end part or parts of the vibrating beam, by which it is anchored on the insulating region, is or are made of doped polycrystalline silicon.

8. An integrated circuit comprising:
   a circuit supporting substrate; and
   a plurality of electromechanical resonators disposed on the circuit supporting substrate, each of the plurality of electromechanical resonators comprising:
     a monocrystalline-silicon substrate provided with an active zone delimited by an insulating region;
     a vibrating beam anchored by at least one of its free ends on the insulating region and comprising a monocrystalline-silicon vibrating central part; and
     a control electrode arranged above the vibrating beam and bearing on the active zone, the central part of the vibrating beam being separated from the active zone and from the control electrode.

9. The integrated circuit according to claim 8, wherein the vibrating beam is made of doped monocrystalline silicon, and in that the end part or parts of the vibrating beam, by which it is anchored on the insulating region, is or are made of doped polycrystalline silicon.

10. The integrated circuit according to claim 8, including at least one detection electrode connected to the active zone.

11. The integrated circuit according to one of claim 10, including two detection electrodes in contact with the active zone and arranged above the central part, on either side of the control electrode, while being separated from the beam.

12. The integrated circuit according to claim 8, wherein, the space between the vibrating beam, on the one hand, and the substrate and the control electrode, on the other hand, being obtained by selective etching of a sacrificial-material layer, and wherein the resonator includes at least a first encapsulation-material layer provided with access holes for access to the sacrificial-material layer and a second encapsulation-material layer used for plugging the access holes after the sacrificial-material layer has been etched through the access holes.

13. The integrated circuit according to claim 12, further including electrical-contact vias for access to the control electrode and to the vibrating beam.

14. The integrated circuit according to claim 13, wherein the vibrating beam is made of doped monocrystalline silicon, and in that the end part or parts of the vibrating beam, by which it is anchored on the insulating region, is or are made of doped polycrystalline silicon.

* * * * *